United States Patent
Wang

(10) Patent No.: US 9,824,255 B2
(45) Date of Patent: Nov. 21, 2017

(54) METHOD FOR MANUFACTURING FINGERPRINT IDENTIFICATION MODULES

(71) Applicant: MiiCs & Partners Inc., Road Town (VG)

(72) Inventor: Juan Wang, Shenzhen (CN)

(73) Assignee: MiiCs & Partners Inc., Road Town (VG)

( * ) Notice: Subject to any disclaimer, the term of this patent is extended or adjusted under 35 U.S.C. 154(b) by 279 days.

(21) Appl. No.: 14/836,382

(22) Filed: Aug. 26, 2015

(65) Prior Publication Data

US 2016/0315246 A1 Oct. 27, 2016

(30) Foreign Application Priority Data

Apr. 22, 2015 (CN) .......................... 2015 1 0192792

(51) Int. Cl.
| | | |
|---|---|---|
| *H01L 41/27* | (2013.01) | |
| *G06K 9/00* | (2006.01) | |
| *H01L 41/297* | (2013.01) | |
| *H01L 41/313* | (2013.01) | |
| *H01L 41/338* | (2013.01) | |

(52) U.S. Cl.
CPC .......... *G06K 9/0002* (2013.01); *H01L 41/313* (2013.01); *H01L 41/338* (2013.01); *H01L 41/27* (2013.01); *Y10T 29/42* (2015.01)

(58) Field of Classification Search
CPC ............... Y10T 29/42; Y10T 29/49787; Y10T 29/49789; Y10T 29/4979; G06K 9/0006; G06K 9/0002; G06K 9/00053; H01L 41/27; H01L 41/277; H01L 41/81; H01L 41/311; H01L 41/312; H01L 41/313

USPC .................. 29/25.35, 411, 412, 413
See application file for complete search history.

(56) References Cited

U.S. PATENT DOCUMENTS

| | | | | |
|---|---|---|---|---|
| 6,960,790 B2* | 11/2005 | Miyai | ................ | G06K 9/00053 257/77 |
| 7,087,970 B2* | 8/2006 | Nakamura | .......... | H01L 41/0471 257/414 |
| 7,266,869 B2* | 9/2007 | Hatanaka | ................ | H01L 24/97 29/25.35 |
| 7,498,723 B2* | 3/2009 | Tsuchido | ............. | H03H 9/0595 310/348 |
| 7,908,721 B2* | 3/2011 | Zipparo | ................ | B06B 1/0629 29/25.35 |

* cited by examiner

*Primary Examiner* — Peter DungBa Vo
*Assistant Examiner* — Joshua D Anderson
(74) *Attorney, Agent, or Firm* — Steven Reiss

(57) ABSTRACT

A method for manufacturing a plurality of fingerprint identification modules simultaneously is provided. A first thin film and a second thin film are formed on a first transfer base and a second transfer base respectively. The first thin film and the second thin film are cut respectively to form a plurality of first thin film units and a plurality of second thin film units. The first transfer base and the second transfer base are adhered on opposite surfaces of a substrate. The first thin film units and the second thin film units are cut respectively to form a plurality of the first piezoelectric layers and a plurality of the second piezoelectric layers. A plurality of first slits and a plurality of second slits are formed on opposite surfaces of the substrate for breaking the mother base into the fingerprint identification modules.

14 Claims, 17 Drawing Sheets

METHOD FOR MANUFACTURING FINGERPRINT IDENTIFICATION MODULES

CROSS-REFERENCE TO RELATED APPLICATIONS

This application claims priority to Chinese Patent Application No. 201510192792.1 filed on Apr. 22, 2015, the contents of which are incorporated by reference herein.

FIELD

The subject matter herein generally relates to a method for simultaneously manufacturing a plurality of fingerprint identification modules.

BACKGROUND

Fingerprint identification apparatuses set in portable electronic devices are used for protecting personal privacy information for improving security functions. The fingerprint identification apparatus includes a plurality of sensors. Each sensor includes a base, a first piezoelectric layer located on a surface of the base, and a second piezoelectric layer located on an opposite surface of the base. While manufacturing the fingerprint identification apparatus, the bases, the first piezoelectric layers, and the second piezoelectric layers are separately formed, the first piezoelectric layer and the piezoelectric voltage layer needs to be separately adhered on the corresponding base.

BRIEF DESCRIPTION OF THE FIGURES

Implementations of the present technology will now be described, by way of example only, with reference to the attached figures.

DETAILED DESCRIPTION

Figure 1:
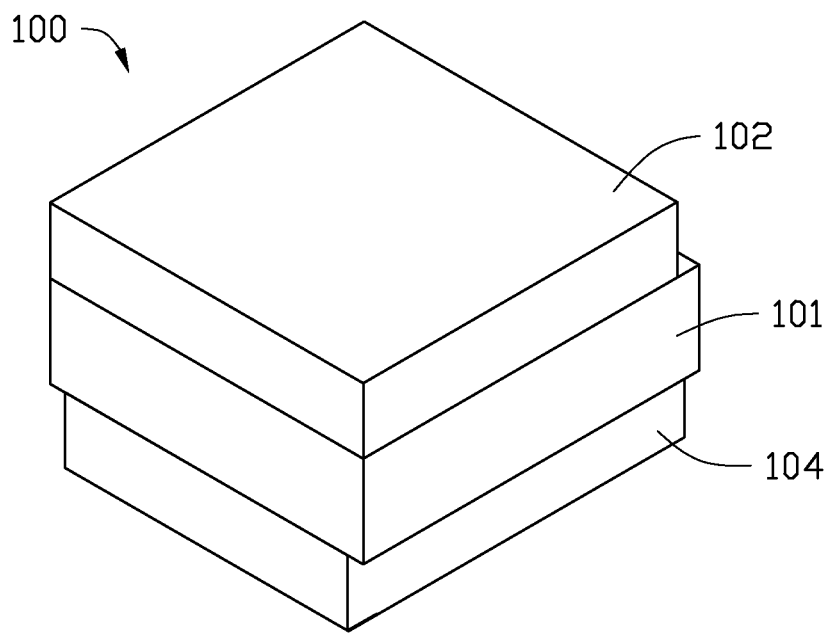
FIG. 1 is an isometric view of an embodiment of a fingerprint identification module.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates a fingerprint identification module 100 of the embodiment. The fingerprint identification module 100 electronically connected to a signal transmitting module (not shown) identifies a fingerprint pressed on the fingerprint identification module 100, and forms an image information for transmitting the signal transmitting module which outputs the received image information to other function modules, such as image display module. In at least one embodiment, the fingerprint identification module 100 is an ultrasonic fingerprint identification module.

Figure 2:
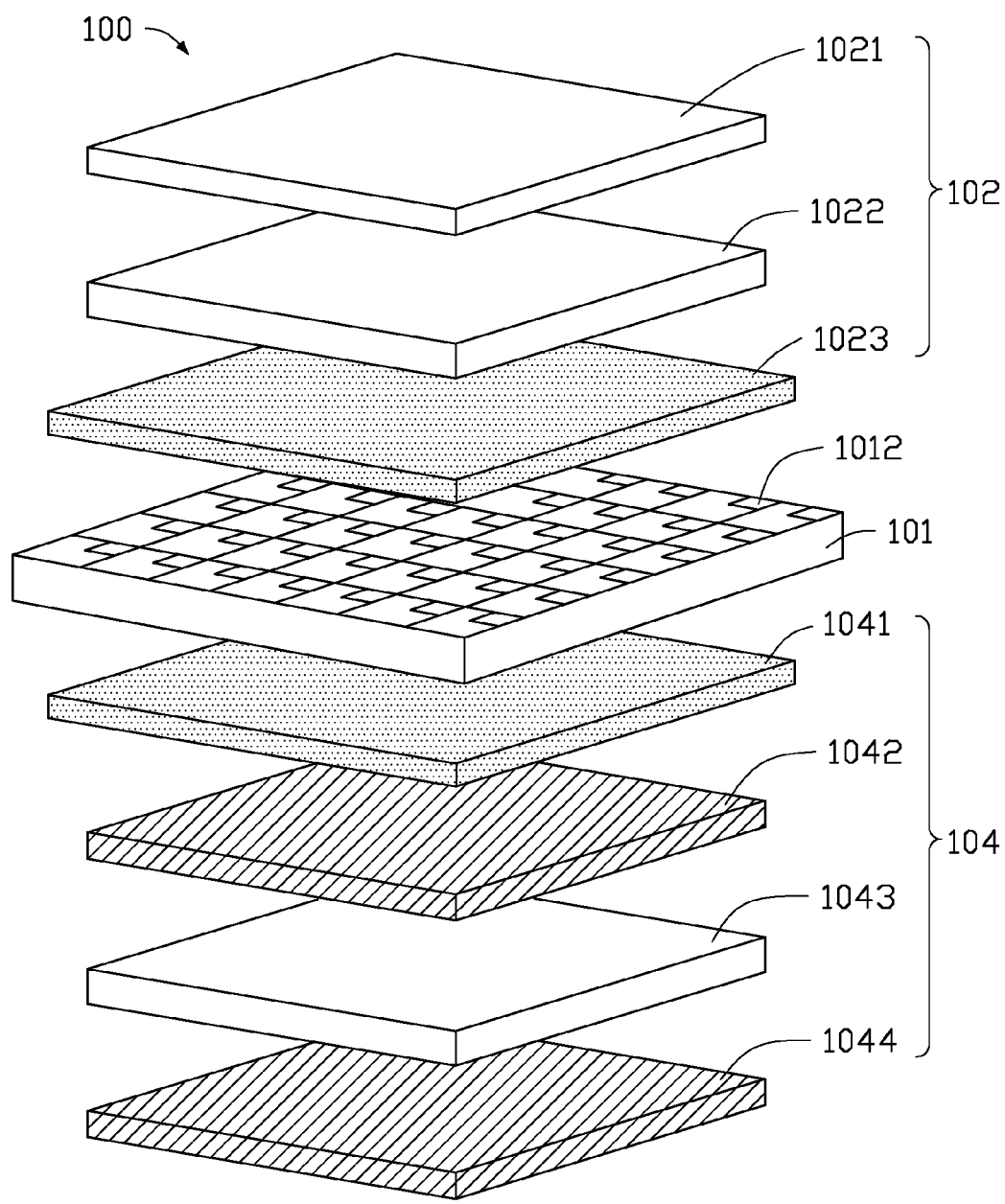
FIG. 2 is a partially exploded view of the fingerprint identification module of FIG. 1.

FIG. 2 illustrates that the fingerprint identification module 100 includes a substrate 101, a first piezoelectric layer 102 located on a top surface of the substrate 101, and a second piezoelectric layer 104 located on a bottom surface of the substrate 101. The first piezoelectric layer 102 includes a first electrode layer 1021 and a signal receiving layer 1022, which are overlapping. The first electrode layer 1021 is located on the top of the signal receiving layer 1022 away from the substrate 101. The signal receiving layer 1022 is adhered on the top of the substrate 101 via a first adhesive layer 1023. The second piezoelectric layer 104 includes a second electrode layer 1042, a signal transmitter layer 1043, and a third electrode layer 1044, which are overlapping. The second electrode layer 1042 and the third electrode layer 1044 is coated on opposite surface of the signal transmission layer 1043. The second electrode layer 1042 is adhered on the bottom surface of the substrate 101 via a second adhesive layer 1041.

The substrate 101 is substantially rectangular shaped. At least one side of the substrate 101 aligns with the first piezoelectric layer 102 and the second piezoelectric layer 104. The substrate 101 includes a plurality of built-in thin film transistors (TFTs) arranged in a matrix to form a TFT array 1012. The TFT array 1012 is simultaneously electrically coupled to the signal receiving layer 1022 and the signal transmitting module. The TFT array 1012 receives the electrical signals from the signal receiving layer 1022 and transfers the received electrical signals into the gray image of the finger pressed on the fingerprint identification module 100.

The first electrode layer 1021 is made of a highly conductive material, such as silver, aluminum, copper, nickel, gold, and so on. In other embodiments, the first electrode layer 1021 is made of transparent conductive material, such as tin indium oxide (ITO), zinc oxide (ZnO), Poly(3,4-ethylenedioxythiophene) (PEDOT), carbon nanotube (CNT), Ag nano wire, and graphene, and so on.

The signal receiving layer 1022 is a piezoelectric thin layer. In at least one embodiment, the signal receiving layer 1022 is made of polyvinylidene fluoride (PVDF). The signal receiving layer 1022 receives feedback signals reflected by the finger, and transfers the feedback signals into electrical signals to transmit to the first electrode layer 1021.

The second electrode layer 1042 cooperates with the third electrode layer 1044 to provide a voltage to the signal transmission layer 1043. The second electrode layer 1042 and the third electrode layer 1044 can be made of metal material or transparent material. In at least one embodiment, the second electrode layer 1042 and the third electrode layer 1044 can be made of the same material. In other embodiments, the second electrode layer 1042 and the third electrode layer 1044 can be made of different materials. For example, the second electrode layer 1042 is made of metal material and the third electrode layer 1044 is made of transparent material, or the second electrode layer 1042 is made of transparent material and the third electrode layer 1044 is made of metal material. In at least one embodiment, the second electrode layer 1042 and the third electrode layer 1044 are made of silver.

The signal transmission layer 1043 is a piezoelectric thin layer. In at least one embodiment, the signal transmission layer 1043 is made of polyvinylidene fluoride (PVDF). The signal transmission layer 1043 vibrates to generate sound waves based on the voltage provided by the second electrode layer 1042 and the third electrode layer 1044. In at least one embodiment, the sound wave is an ultrasonic wave.

When the fingerprint identification module 100 operates, the second electrode layer 1042 and the third electrode layer 1044 cooperate to provide the voltage to the signal transmission layer 1043, the signal transmission layer 1043 vibrates to generate ultrasonic wave. When a finger is pressed on the fingerprint identification module 100, the ultrasonic wave reflected by the finger is provided to the signal receiving layer 1022, energy of the reflected ultrasonic wave is changed based on ridges and valleys of the pressed finger. The signal receiving layer 1022 transfers the received reflected ultrasonic wave into electrical signals to transmit to the TFT array 1012. The TFT array 1012 converts the received electrical signals into a gray image of the pressed finger.

Figure 3:
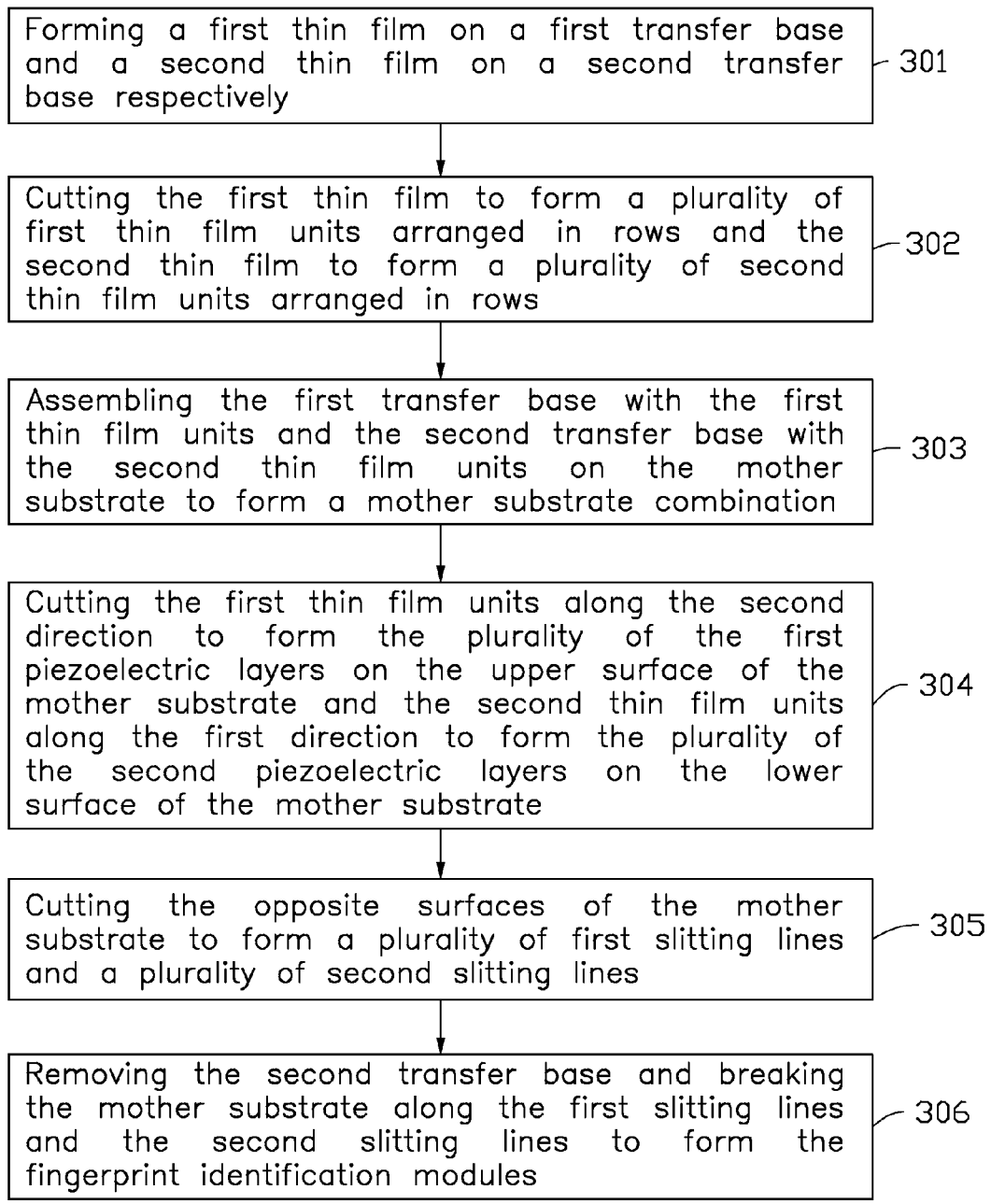
FIG. 3 is a flowchart of an embodiment of a method for simultaneously manufacturing a plurality of the fingerprint identification modules of FIG. 1.

FIG. 3 illustrates a flowchart of an embodiment of a method 300 for simultaneously manufacturing a plurality of the fingerprint identification modules 100 on a substrate 10. The method 300 is provided by way of example, as there are a variety of ways to carry out the method. The method 300 described below can be carried out using the configurations illustrated in FIG. 1, for example, and various elements of these figures are referenced in explaining the method 300. Each block shown in FIG. 3 represents one or more processes, methods or subroutines, carried out in the method 300. Furthermore, the order of blocks is illustrative only and the order of the blocks can change according to the present disclosure. Additional blocks can be added or blocks can be removed, without departing from this disclosure. The method 300 can begin at block 301.

Figure 4:
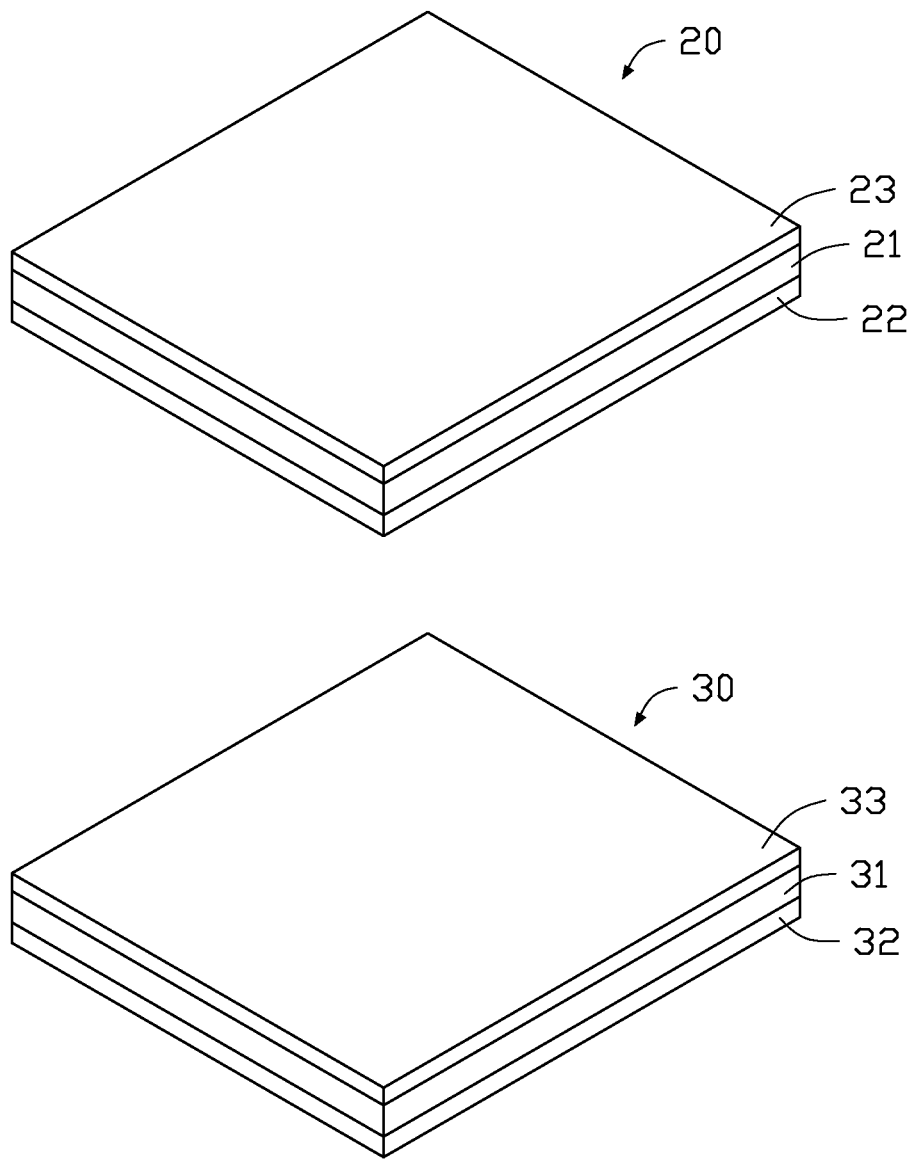
FIG. 4 is an isometric view of an embodiment of a first thin film group and a second thin film group of the manufacturing process of FIG. 3, the first thin film group comprising a first protection layer and the second thin film group comprising a second protection layer.

At block 301, a first thin film 21 is formed on a first transfer base 22 and a second thin film 31 is formed on a second transfer base 32 respectively. FIG. 4 illustrates that a first thin film group 20 and a second thin film group 30 are separated from each other. The first thin film group 20 includes the first thin film 21, the first transfer base 22 located on a bottom surface of the first thin film 21 for loading the first thin film 21, a first protection layer 23 located on a top surface of the first thin film 21. The first thin film 21 includes a plurality of the first electrode layers 102. The second thin film group 30 includes the second thin film 31, the second transfer base 32 located on a bottom surface of the second thin film 31 for loading the second thin film 31, and a second protection layer 33 located on a top surface of the second thin film 31. The second thin film 31 includes a plurality of the second electrode layers 104. In at least one embodiment, the first thin film group 20 and the second thin film group 30 have a common size and a common shape. The first thin film group 20 and the second thin film group 30 are substantially cubic shaped. The first transfer base 22, the second transfer base 32, the first protection layer 23, and the second protection layer 33 are made of a same rigid material, such as glass, quartz, organic polymer, and so on. The first transfer base 22 and the second transfer base 32 load the first thin film 21 and the second thin film 31 respectively before next operation. The first protection layer 23 and the second protection layer 33 respectively protect the first thin film 21 and the second thin film 31 before further operation.

Figure 5:
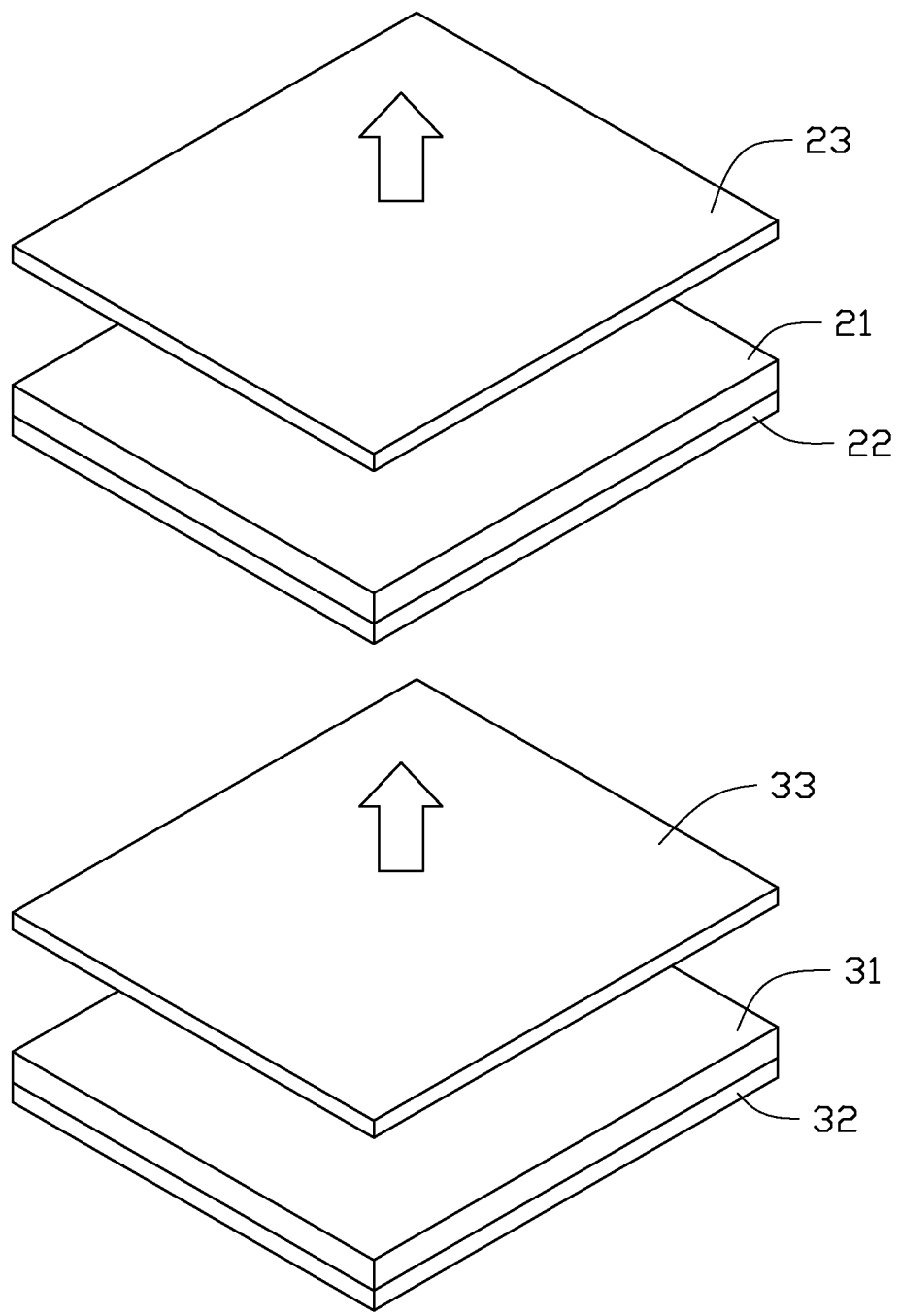
FIG. 5 is an isometric view of an embodiment of the first thin film group and the second thin film group removing the first protection layer and the second protection layer of the manufacturing process of FIG. 3.

FIG. 5 illustrates that the first thin film group 20 and the second thin film group 30 are transmitted to a corresponding work station for removing the first protection layer 23 and the second protection layer 33 respectively, which causes the first thin film 21 and the second thin film 31 to be formed on the first transfer base 22 and the second transfer base 32. In at least one embodiment, the removing operations of the first protection layer 23 and the second protection layer 33 are simultaneously executed on different working stations.

At block 302, the first thin film 21 is cut to form a plurality of first thin film units 211 arranged in rows and the second thin film 31 is cut to form a plurality of second thin film units 311 arranged in rows. Each of the adjacent first thin film units 211 forms a first slot 213, and each of the adjacent second thin film units 311 forms a second slot 313 (as shown in FIG. 6).

Figure 6:
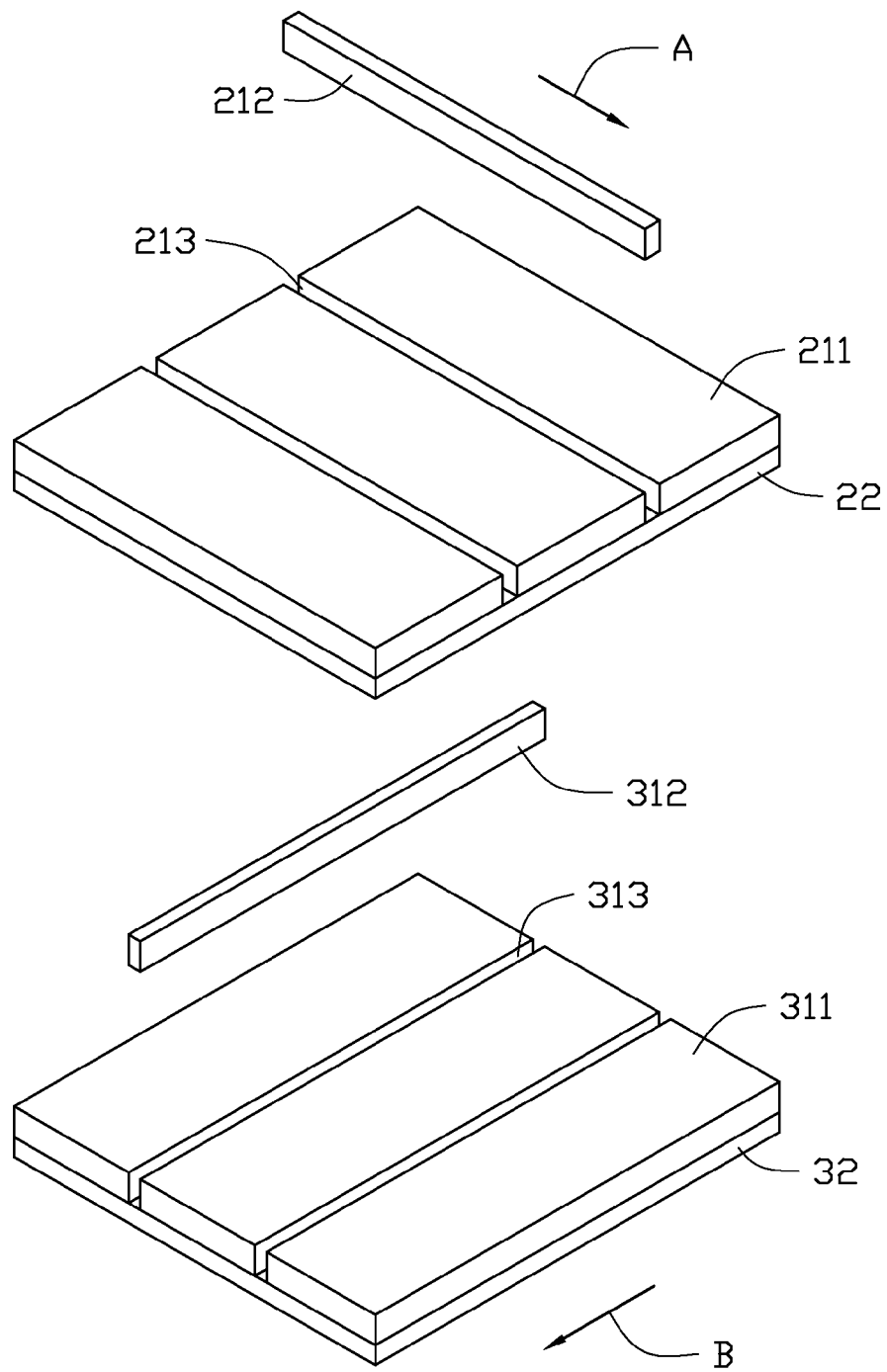
FIG. 6 is an isometric view of an embodiment of cutting the first thin film and the second thin film of the manufacturing process of FIG. 3.

FIG. 6 illustrates that a first knife cuts the first thin film 21 to form a plurality of first cutoff units 212, and a second knife cuts the second thin film 31 to form a plurality of second cutoff units 312. In at least one embodiment, the first knife cuts the first thin film along a first direction A, such as X-axis. The second knife cuts the second thin film along a second direction B, such as Y-axis, perpendicular to the first direction A. The first cutoff units 212 are removed to define the first slots 213 and the first thin film units 211, and the second cutoff units 312 are removed to define the second slots 313 and the second thin film units 311. The first slots 213 and the second slots 313 are substantially strip shaped, and are perpendicular to each other. A depth being cut of the first thin film 21 is equivalent to a depth being cut of the second thin film 31. The first thin film units 211 and the second thin film units 311 are cut on different working stations. In other embodiments, the first thin film 31 and the second thin film 32 are cut along a same direction to form the first thin film units 211 and the second thin film units 311 are arranged in rows, and then the first transfer base 22 or the second transfer base 32 is rotated for aligning the first thin film units 211 perpendicular to the second thin film units 311 via a manipulator arm, a rotating machine, or both.

At block 303, the first transfer base 22 with the first thin film units 211 and the second transfer base 32 with the second thin film units 311 are assembled on the substrate 10 to form a substrate combination 1. The substrate 10 includes a plurality of the built-in TFT arrays 1012 (not shown) corresponding to the first piezoelectric layers 102 and the second piezoelectric layer 104 respectively. Each of the TFT arrays 1012 includes a plurality of TFTs arranged in a matrix.

Figure 7:
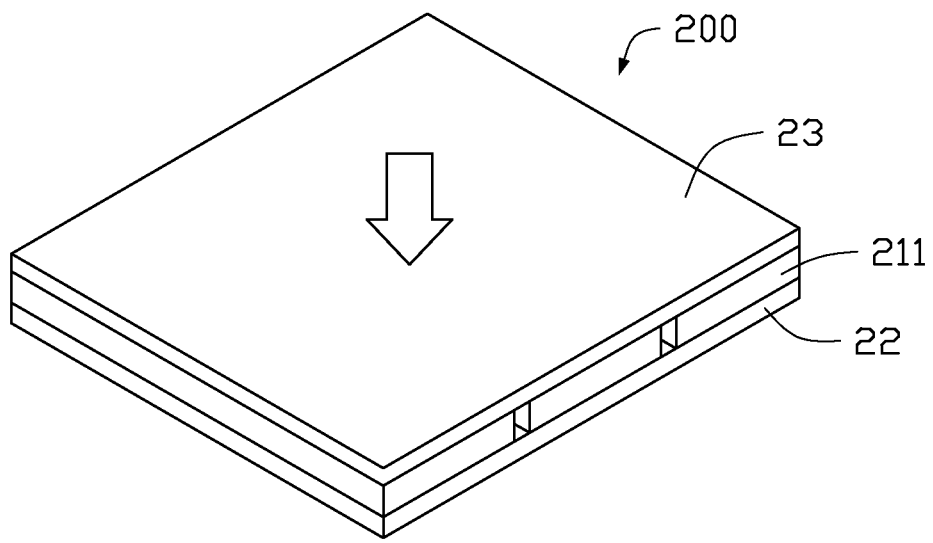
FIG. 7 is an isometric view of an embodiment of forming a first thin film combination and a second thin film combination formed of the manufacturing process of FIG. 3, the first thin film combination comprising the first protection layer and the second thin film combination comprising the second protection layer.
Figure 7:
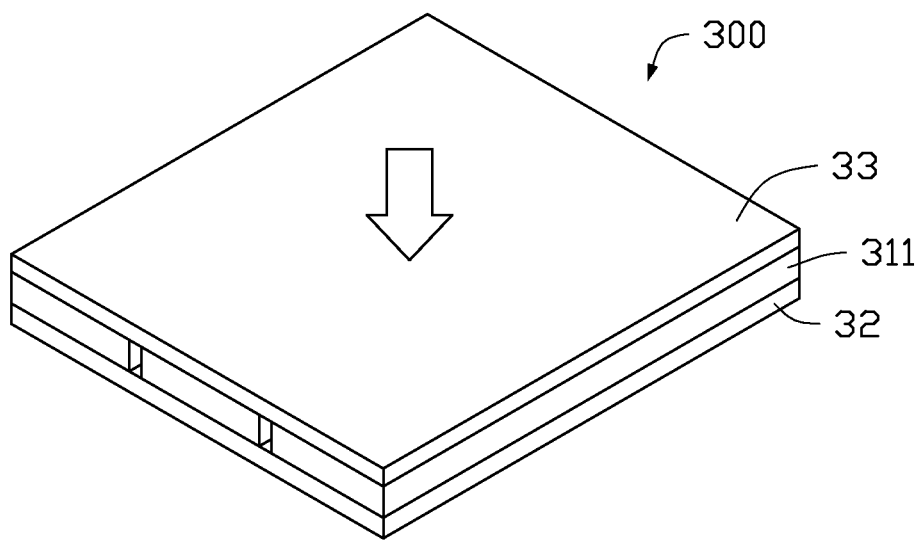

FIG. 7 illustrates that the first protection layer 23 is covered over the first thin film units 211 to form a first thin film combination 200 and the second protection layer 33 is covered over the second thin film units 311 to form a second thin film combination 300. The first thin film combination 200 includes the first thin film units 211, the first transfer base 22 located on the bottom surfaces of the first thin film units 211 for loading the first thin film units 211, and the first protection layer 23 located on the top surfaces of the first thin film units 211. The second thin film combination 300 includes the second thin film units 311, the second transfer base 22 located on the bottom surfaces of the second thin film units 311 for loading the second thin film units 311, and the second protection layer 33 located on the top surfaces of the second thin film units 311. The first protection layer 23 and the second protection layer 33 respectively protect the first thin film units 211 and the second thin film units 311 from being contaminated while being transported from the cutting station to the next station.

Figure 8:
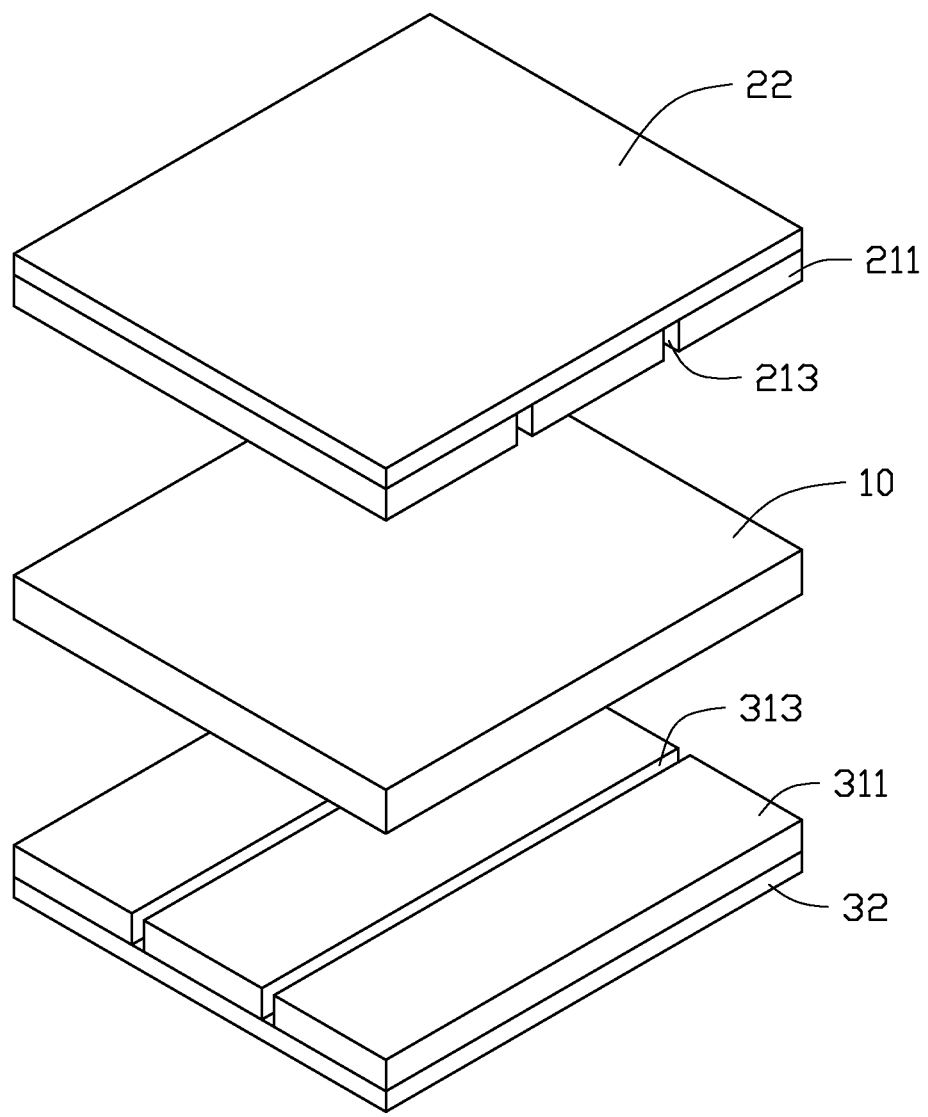
FIG. 8 is an isometric view of an embodiment of forming a substrate combination of the manufacturing process of FIG. 7.

FIG. 8 illustrates that the first thin film combination 200 and the second thin film combination 300 are being transported to the next station. The first protection layer 23 and the second protection layer 33 are respectively removed from the first thin film combination 200 and the second thin film combination 300. The first thin film combination 200 without the first protection layer 23 adheres on a top surface of the substrate 10 and the second thin film combination 300 without the second protection layer 33 adheres on a bottom surface of the substrate 10, thus the substrate combination 1 is formed. In at least one embodiment, the first thin film units 211 are adhered on the top surface of the substrate 10 via a first adhesive layer (not shown), and the first transfer base 22 is covered on the top surfaces of the first thin film units 211. The second thin film units 311 are adhered on the bottom surface of the substrate 10 via a second adhesive layer (not shown), and the second transfer base 32 is covering the bottom surfaces of the second thin film units 311. The first slot 213 is parallel with the first direction A, and the second slot 313 is parallel with the second direction B. The substrate 10 is substantially cube shaped. An area of the substrate 10 is equivalent to an area of the first transfer base 22 or an area of the second transfer base 32. In at least one embodiment, the substrate 10 is made of glass.

At block 304, the first thin film units 211 is cut along the second direction to form the plurality of the first piezoelectric layers 102 on the top surface of the substrate 10 and the second thin film units 311 is cut along the first direction to form the plurality of the second piezoelectric layers 104 on the bottom surface of the substrate 10. In other embodiments, when the cutting operation in block 304 and the assembling operation in block 303 are operated in a common device, the recovering operation of the first protection layer 23 and the second protection layer 33 in the block 303 can be omitted.

Figure 9:
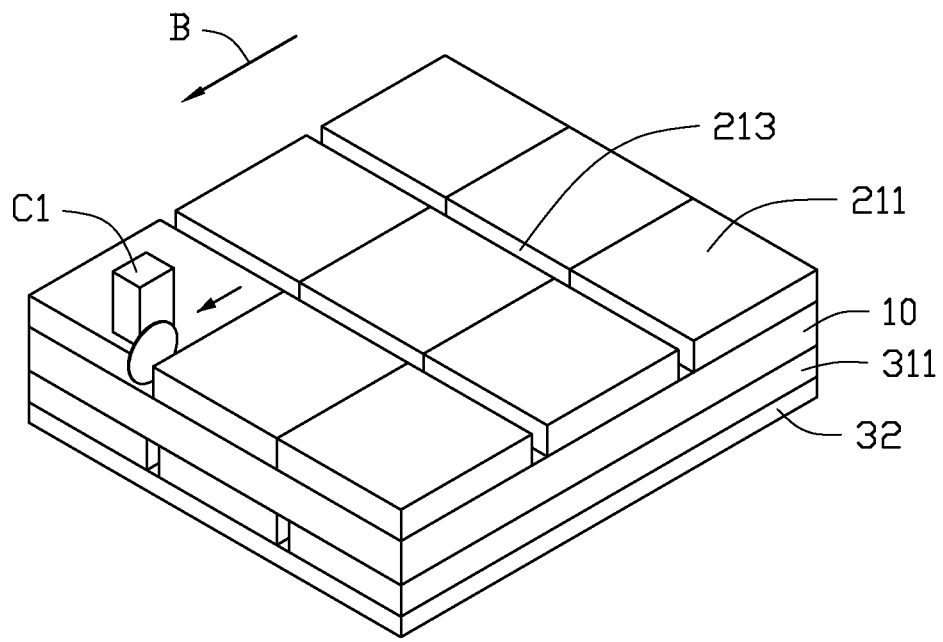
FIG. 9 is an isometric view of an embodiment of forming a plurality of first piezoelectric layers of the manufacturing process of FIG. 3.

In detail, FIG. 9 illustrates that the first transfer base 22 is removed, a third knife C1 cuts the first thin film units 211 along the second direction B, such as Y-axis, to form the plurality of the first piezoelectric layers 102. A depth being cut of the first thin film unit 211 cut by the third knife C1 is equivalent to the depth being cut of the first thin film unit 211 cut by the first knife.

Figure 10:
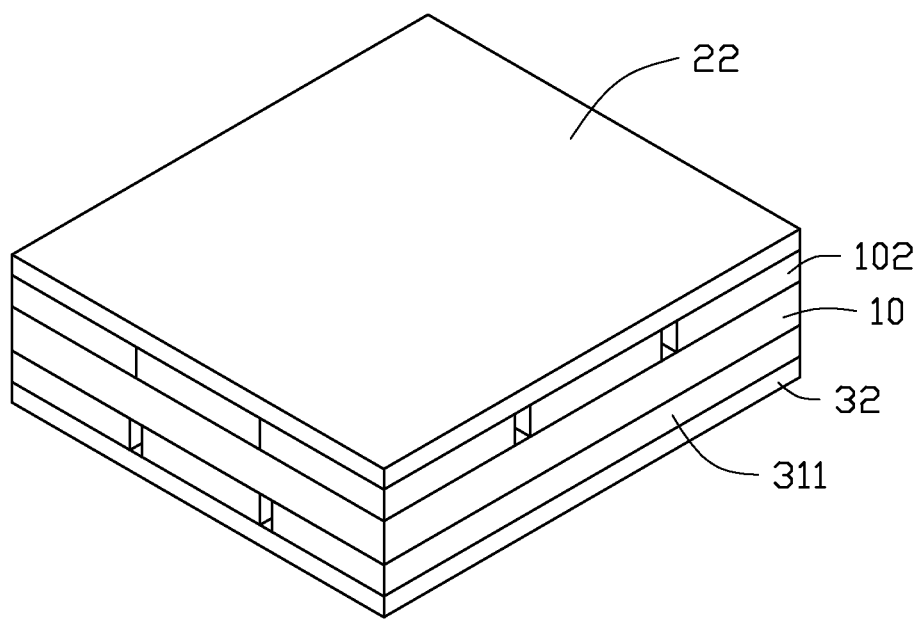
FIG. 10 is an isometric view of an embodiment of the first piezoelectric layers being covered by a protection layer of the manufacturing process of FIG. 9.

FIG. 10 illustrates that a protection layer is formed on the first thin film units 211 for protecting the first piezoelectric layers 102. In at least one embodiment, the first transfer base 21 is covered over the first thin film units 211.

Figure 11:
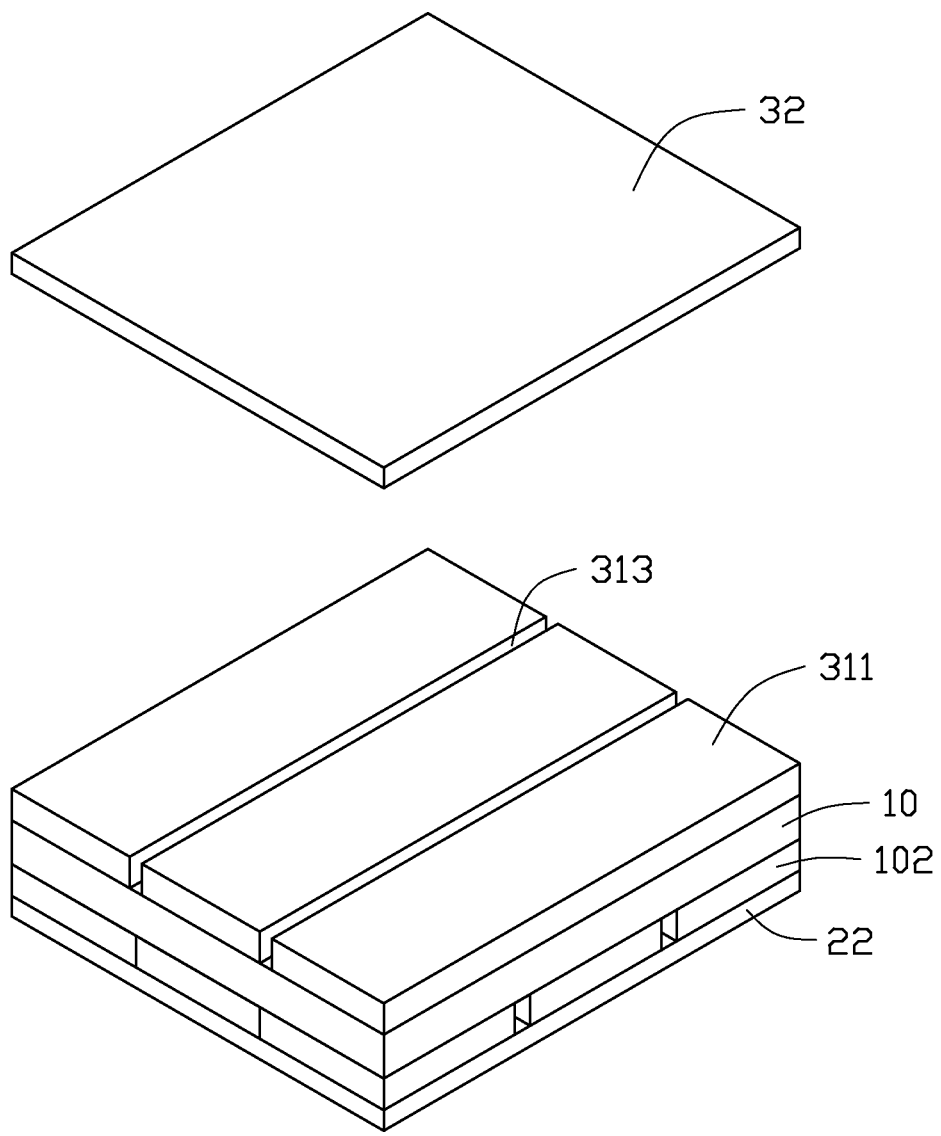
FIG. 11 is an isometric view of an embodiment of flipping the substrate combination of the manufacturing process of FIG. 10.

FIG. 11 illustrates that the substrate 10 is being vertically flipped. After the flipping operation, the surface of the substrate 10 with the second thin film units 311 faces upwards, and the surface of the substrate 10 with the first piezoelectric layers 102 faces downwards. The second slot 313 is parallel with the second direction B. The second transfer base 32 is removed.

Figure 12:
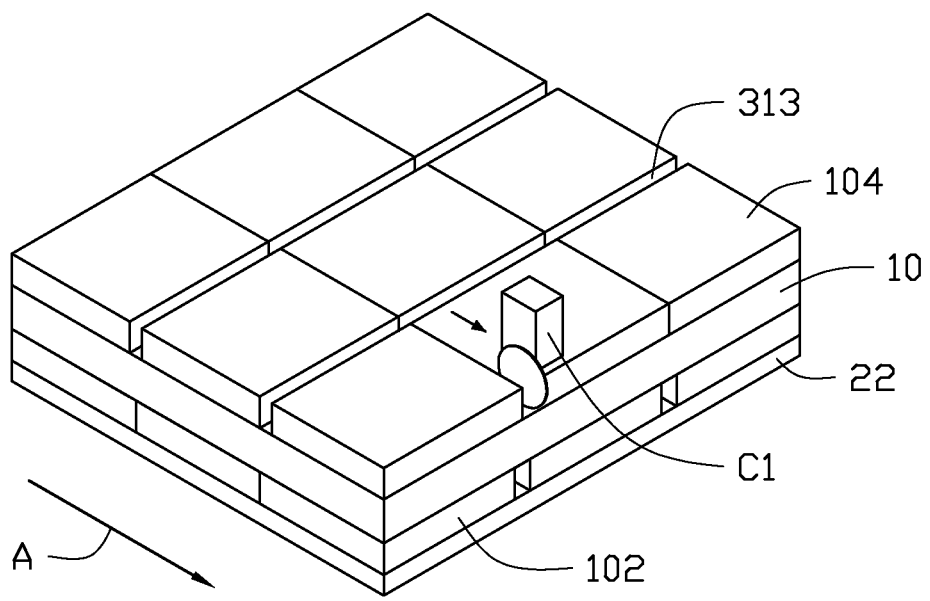
FIG. 12 is an isometric view of an embodiment of forming a plurality of second piezoelectric layers of the manufacturing process of FIG. 11.

FIG. 12 illustrates that the third knife C1 cuts the second thin film units 311 along the first direction A, such as X-axis, to form the plurality of the second piezoelectric layers 104. A depth being cut of the second thin film unit 311 by the third knife C1 is equivalent to a depth being cut of the second thin film unit 311 by the second knife. The cutting operations of the first thin film units 211 and the second thin film units 311 are executed via a common device in a common station.

At block 305, the opposite surfaces of the substrate 10 is cut to form a plurality of first slits 11 and a plurality of second slits 12. Each of the first slits 11 is located at the corresponding first slot 213, and each of the second slits 12 is located at the corresponding second slot 313.

Figure 13:
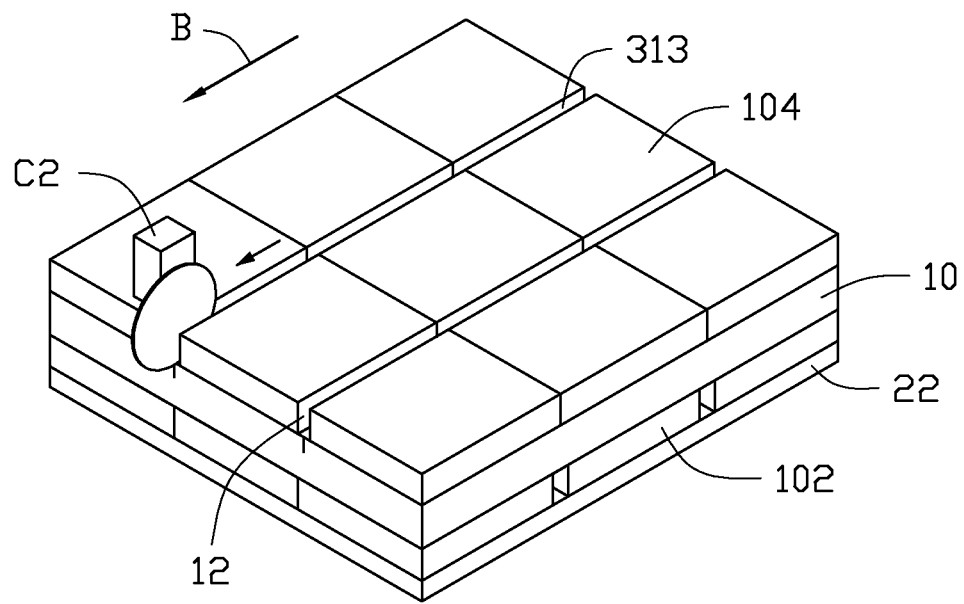
FIG. 13 is an isometric view of an embodiment of forming a plurality of second slits of the manufacturing process of FIG. 12.

In detail, FIG. 13 illustrates that a fourth knife C2 cuts the substrate 10 along the second direction B to form the second slits 12. A moving path of the fourth knife C2 is parallel with the second slot 313. A depth being cut of the second slit 12 is related to material of the substrate 10. In at least one embodiment, the depth being cut of the second slit 12 is within a range of 0.2T-0.5T, and T represents a thickness of the substrate 10.

Figure 14:
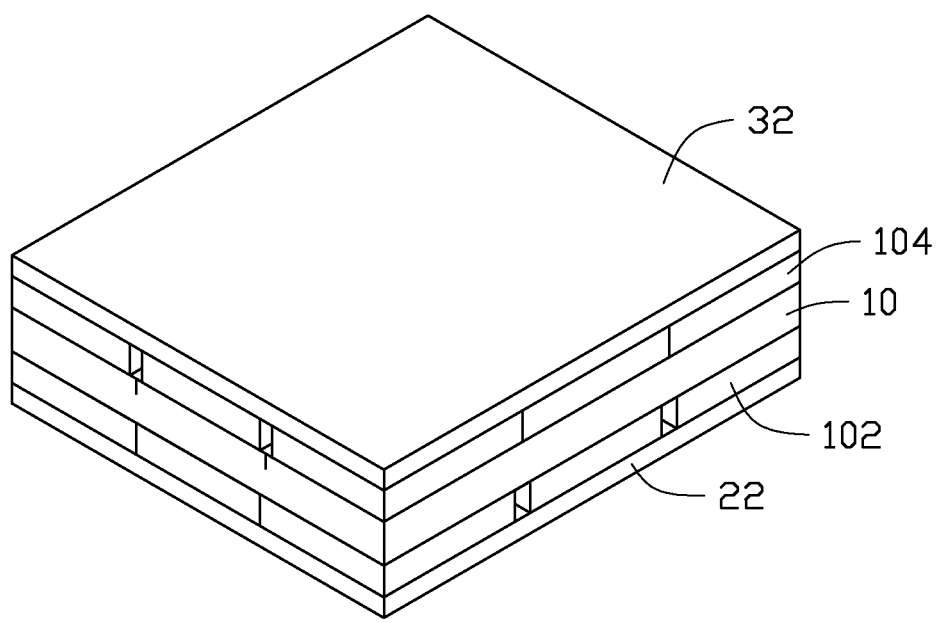
FIG. 14 is an isometric view of an embodiment of covering the second piezoelectric layers of the manufacturing process of FIG. 13.

FIG. 14 illustrates that the second transfer base 32 is recovered over the second piezoelectric layers 104.

Figure 15:
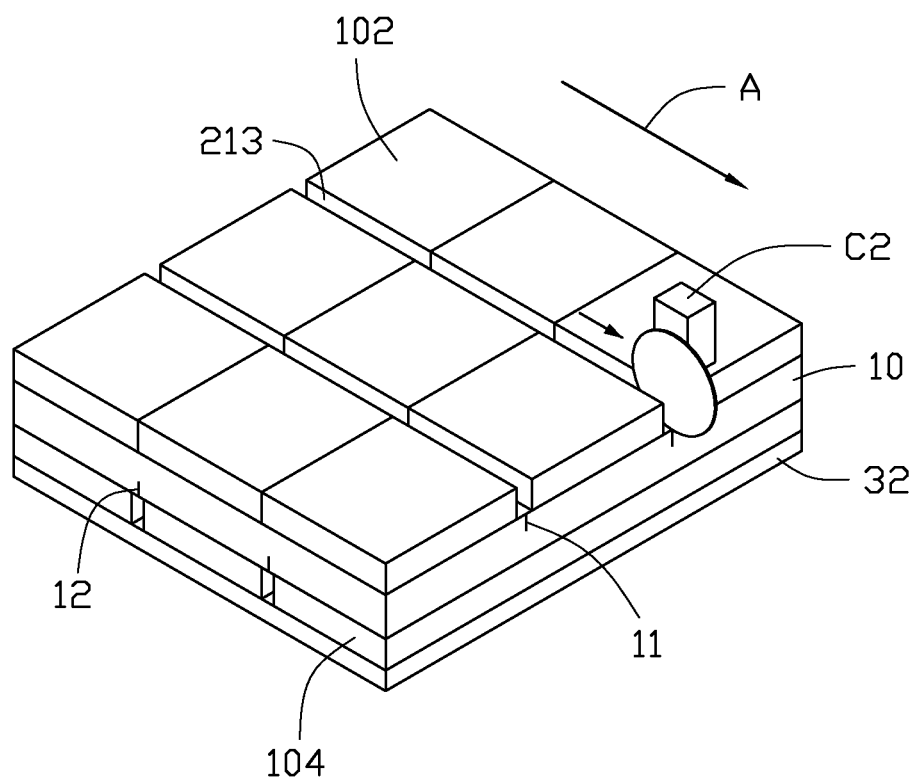
FIG. 15 is an isometric view of an embodiment of flipping the substrate combination of the manufacturing process of FIG. 14.

FIG. 15 illustrates that the substrate 10 is being vertically flipped again. After the flipping operation, the surface of the substrate 10 with the first thin film units 311 faces upwards, and the surface of the substrate 10 with the second piezoelectric layers 102 faces downwards. The first transfer base 22 is removed again. The fourth knife C2 cuts the surface of the substrate 10 along the first direction A to form the first slits 11. A moving path of the fourth knife C2 is parallel with the first slot 213. A depth of the cut of the first slit 11 is related to the material of the substrate 10. In at least one embodiment, the depth of the cut of the first slit 11 is within a range of 0.2T-0.5T, and T represents a thickness of the substrate 10.

Figure 16:
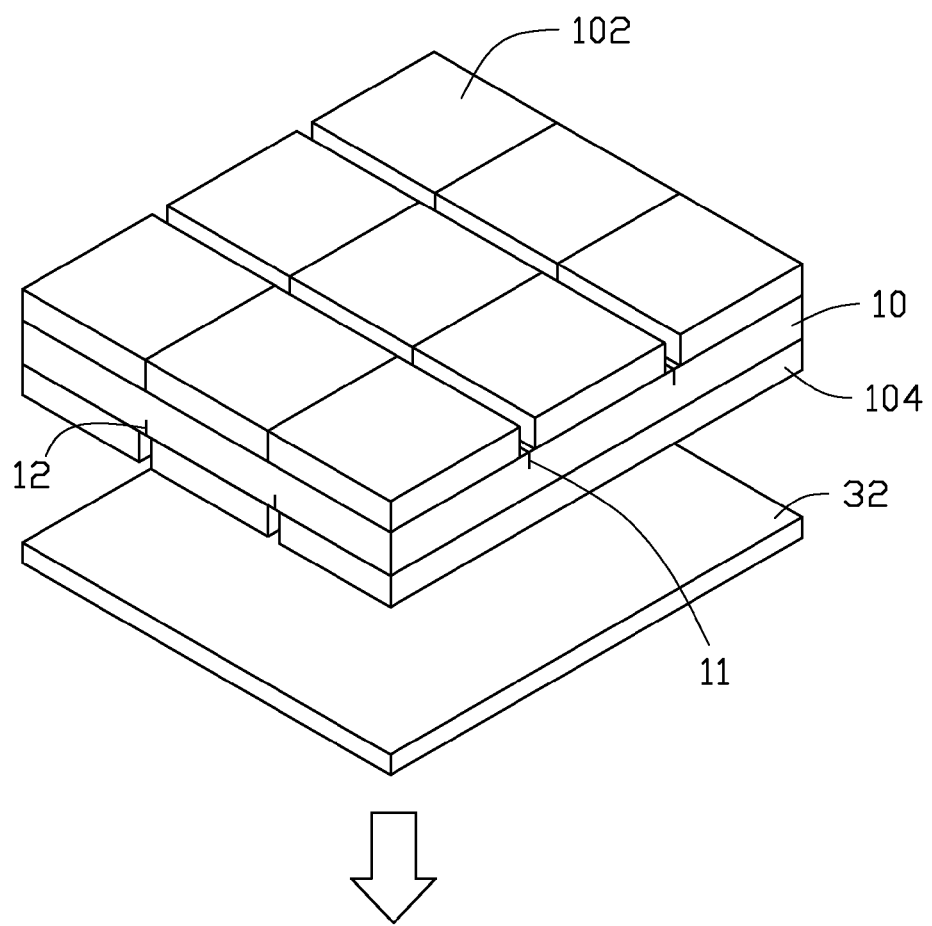
FIG. 16 is an isometric view of an embodiment of removing the second transfer base of the manufacturing process of FIG. 15.
Figure 17:
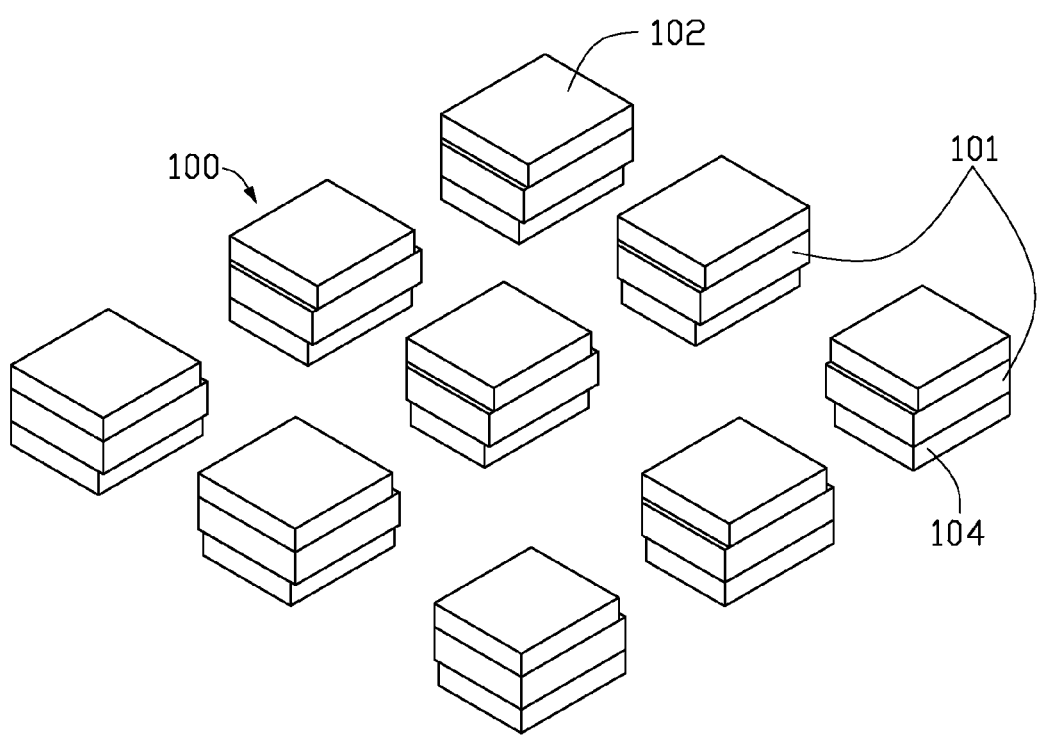
FIG. 17 is an isometric view of an embodiment of forming a plurality of fingerprint identification modules of the manufacturing process of FIG. 16.

At block 306, the second transfer base 32 is removed and the substrate 10 is broken along the first slits 11 and the second slits 12 to form the fingerprint identification modules 100 (as shown in FIGS. 16 and 17). The breaking operation of the substrate 10 is executed via a machine.

The method first forms the first thin film 21 with the plurality of the first piezoelectric layers 102 on the first transfer base 22 and the second thin film 31 with the plurality of the second piezoelectric layers 104 on the second transfer base 32, the first thin film 21 and the second thin film 31 are cut to form the plurality of the first thin film units 211 and the plurality of the second thin film units 311 respectively, the first thin film units 211 and the second thin film units 311 are adhered on the opposite surfaces of the substrate 10 respectively, and the substrate 10 is cut, which cause the plurality of the fingerprint identification modules 100 to be formed simultaneously. The first piezoelectric layers 102 and the second piezoelectric layers 104 respectively correspond to the TFT array 1012. Therefore, the process for manufacturing the fingerprint identification module 100 is improved.

While various exemplary and preferred embodiments have been described, the disclosure is not limited thereto. On the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A method for manufacturing a plurality of fingerprint identification modules simultaneously, the method comprising:
   a) forming a first thin film on a first transfer base and a second thin film on a second transfer base;
   b) cutting the first thin film to form a plurality of first thin film units arranged in rows and the second thin film to form a plurality of second thin film units arranged in rows;
   c) assembling the first transfer base with the first thin film units and the second transfer base with the second thin film units on opposing surfaces of a substrate to form a combination substrate in which the rows of the first thin film units are perpendicular to the rows of the second thin film units;
   d) cutting the first thin film units in a direction perpendicular to the rows of the first thin film units to form a plurality of the first piezoelectric layers and the second thin film units in a direction perpendicular to the rows of the second thin film units to form a plurality of the second piezoelectric layers;
   e) cutting the opposing surfaces of the substrate to form a plurality of first slits located between two adjacent first thin film units and arranged parallel to the rows of the first thin film units and a plurality of second slits located between two adjacent second thin film units and arranged parallel to the rows of the second thin film units; and
   f) removing the second transfer base and breaking the substrate along the first slits and the second slits to form fingerprint identification modules.

2. The method of claim 1, wherein the step a) further comprising:
   covering a first protection layer on the first thin film and a second protection layer on the second thin film respectively.

3. The method of claim 2, wherein the first transfer base, the second transfer base, the first protection layer, and the second protection layer are made of a common material.

4. The method of claim 2, wherein the step b) further comprising:
   removing the first protection layer and the second protection layer respectively before cutting the first thin film and the second thin film; and
   recovering the first protection layer over the first thin film units and the second protection layer on the second thin film units respectively after cutting the first thin film and the second thin film.

5. The method of claim 4, wherein the step c) further comprising:
   removing the first protection layer and the second protection layer respectively before assembling the first thin film units and the second thin film units on the substrate.

6. The method of claim 1, wherein the step b) further comprising:
   forming a plurality of first cutoff units while a first knife cuts the first thin film, and a plurality of second cutoff units while a second knife cuts the second thin film; and
   removing the first cutoff units to form the first thin film units and a plurality of first slots, and removing the second cutoff units to form the second thin film units and a plurality of second slots.

7. The method of claim 6, wherein each of the first slots is located between two adjacent first thin film units, and each of the second slots is located between two adjacent second thin film units.

8. The method of claim 7, wherein each of the first slits is located in the corresponding first slots, and each of the second slits is located in the corresponding second slots.

9. The method of claim 1, wherein depths being cut of the first slits and the second slits are within a range of 0.2T-0.5T, and T represents a thickness of the substrate.

10. The method of claim 1, wherein at least one side of the substrate aligns with the first piezoelectric layer and the second piezoelectric layer.

11. The method of claim 1, wherein the first piezoelectric layer comprises a first electrode layer and a signal receiving layer; the second piezoelectric layer comprises a second electrode layer, a signal transmitting layer, and a third electrode layer; the first electrode layer and the signal receiving layer are orderly overlapped, the second electrode layer, the signal transmitting layer, and the third electrode layer are orderly overlapped; the signal receiving layer and the second electrode layer are adhered on opposite surfaces of the substrate; the signal receiving layer is away from the substrate.

12. The method of claim 1, wherein the first thin film is cut along a first direction to form the first thin film units, and the second thin film is cut to form the second thin film units along a second direction perpendicular to the first direction.

13. The method of claim 1, wherein the first thin film and the second thin film are cut along a same direction to form the first thin film units and the second thin film units respectively.

14. The method of claim 13, wherein the step b) further comprising: rotating one of the first transfer base and the second transfer base for making the rows of the first thin film units perpendicular to the rows of the second thin film units.

* * * * *